United States Patent
Shiota (10) Patent No.: US 7,207,019 B2
(45) Date of Patent: Apr. 17, 2007

(54) TEST CIRCUIT INSERTING METHOD AND APPARATUS FOR A SEMICONDUCTOR INTEGRATED CIRCUIT

(75) Inventor: Ryoji Shiota, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 280 days.

(21) Appl. No.: 10/976,323

(22) Filed: Oct. 29, 2004

(65) Prior Publication Data

US 2005/0132254 A1  Jun. 16, 2005

(30) Foreign Application Priority Data

Oct. 31, 2003  (JP)  ............. P. 2003-371761

(51) Int. Cl.
*G06F 17/50* (2006.01)
*G06F 11/00* (2006.01)
*G01R 31/28* (2006.01)

(52) U.S. Cl. ............. 716/5; 716/2; 716/10; 716/13; 716/14; 714/30; 714/726

(58) Field of Classification Search ............. 716/5, 716/2, 10, 13, 14; 714/30, 726
See application file for complete search history.

(56) References Cited

U.S. PATENT DOCUMENTS

| | | | | |
|---|---|---|---|---|
| 5,450,414 A | * | 9/1995 | Lin | 714/726 |
| 5,737,340 A | * | 4/1998 | Tamarapalli et al. | 714/733 |
| 6,038,691 A | * | 3/2000 | Nakao et al. | 714/733 |
| 6,059,451 A | * | 5/2000 | Scott et al. | 714/726 |
| 6,070,261 A | * | 5/2000 | Tamarapalli et al. | 714/733 |
| 6,301,688 B1 | * | 10/2001 | Roy | 716/4 |
| 6,782,515 B2 | * | 8/2004 | Scott et al. | 716/4 |
| 6,922,803 B2 | * | 7/2005 | Nakao et al. | 714/738 |
| 7,036,060 B2 | * | 4/2006 | Nakao et al. | 714/726 |
| 2002/0073373 A1 | * | 6/2002 | Nakao et al. | 714/738 |
| 2003/0154432 A1 | * | 8/2003 | Scott et al. | 714/724 |
| 2003/0200492 A1 | * | 10/2003 | Nakao et al. | 714/724 |

FOREIGN PATENT DOCUMENTS

JP   2000-250946 A   9/2000

* cited by examiner

*Primary Examiner*—Phallaka Kik
(74) *Attorney, Agent, or Firm*—McDermott Will & Emery LLP (57) ABSTRACT

A method to reduce the load of layout design and attain a high fault coverage while preventing increase in chip size in test point insertion for a semiconductor integrated circuit. Initial layout is performed on the basis of the circuit information. Interconnection pairs are extracted from a layout result. Test point insertion candidates are extracted on the basis of the controllability probabilities and the interconnection pairs. If test point insertion candidates exist, test point insertion positions are selected. Circuit structures of test points to be inserted there are selected. Test points having those circuit structures are inserted virtually. Whether the circuit overhead of a layout result is within a prescribed range is judged. If the circuit overhead exceeds the prescribed range, the number of test points is reduced.

14 Claims, 12 Drawing Sheets

TEST CIRCUIT INSERTING METHOD AND APPARATUS FOR A SEMICONDUCTOR INTEGRATED CIRCUIT

BACKGROUND OF THE INVENTION

1. Field of the Invention

The present invention relates to a design-for-testability technique for a semiconductor integrated circuit and, in particular, to a test circuit inserting method and a test circuit inserting apparatus.

2. Description of the Related Art

Design-for-testability techniques as typified by scan design are employed widely to attain a sufficiently high fault coverage in tests of semiconductor integrated circuits. However, with the increase in the circuit scale and the complexity of circuits, the processing time for generation of test patterns for attaining a desired fault coverage tends to increase. One countermeasure employed is a method of increasing the testability by inserting test points in a circuit.

In a conventional test circuit inserting method for a semiconductor integrated circuit, a model circuit is configured on a computer in such a manner that logic elements and signal lines are arranged in the same manner as in a test subject circuit. Fault coverage and fault prevention information of each signal line are obtained by performing a fault simulation by inputting test patterns to the model circuit. Test point insertion points are determined on the basis of those kinds of information and test circuits are inserted. (Refer to JP-A-2000-250946, for example).

Figure 19:
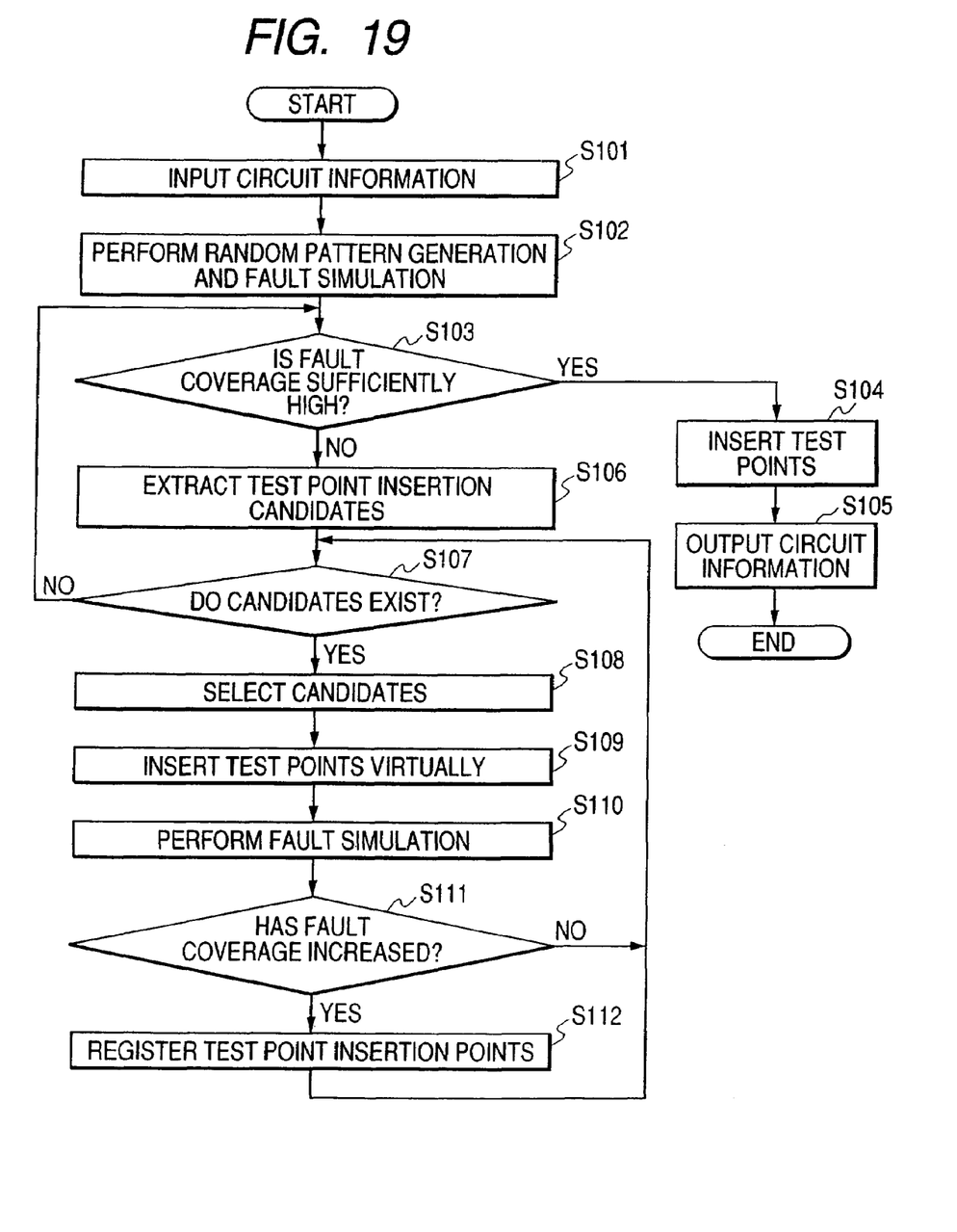
FIG. 19 is a flowchart of a process of a conventional test circuit inserting method for a semiconductor integrated circuit.

FIG. 19 is a flowchart of a process of a conventional test circuit inserting method for a semiconductor integrated circuit. As shown in FIG. 19, circuit information is input at step S101, random pattern generation and a fault simulation are performed at step S102, whether fault coverage is sufficiently high is judged at step S103, and test points are inserted at step S104 if the fault coverage is sufficiently high, and circuit information is output at step S105.

If it is judged at step S103 that the fault coverage is not sufficiently high, test point insertion candidates are extracted at step S106. Whether candidates exist is judged at step S107, the candidates are selected at step S108, and test points are inserted virtually at step S109. A fault simulation is performed at step S110 and whether the fault coverage has increased is judged at step S111. If the fault coverage has increased, the current test point insertion points are registered at step S112. Then, step S107 and the following steps are executed again.

In the fault simulation at step S110, fault coverage and fault prevention information of each signal line are obtained and test point insertion points are determined on the basis of those kinds of information. With This method, a high fault coverage is obtained while preventing increase in chip size.

However, in the above method, test points are merely determined on the basis of fault coverage and fault prevention information that are obtained by a fault simulation and the layout-related aspect of insertion of test circuits is not taken into account. Therefore, the above method has a problem that wiring congestion is caused by insertion of test circuits, resulting in increase in chip size.

SUMMARY OF THE INVENTION

An object of the present invention, to solve the above problem in the art, is to provide a test circuit inserting method and apparatus for a semiconductor integrated circuit which can reduce, for test point insertion points obtained by a conventional technique, the load of layout design that is performed after insertion of test circuits as well as can attain a high fault coverage while preventing increase in chip size.

To attain the above object, a test circuit inserting method for a semiconductor integrated circuit according to the invention comprises the steps of inputting circuit information; calculating controllability probabilities on the basis of the circuit information; performing initial layout on the basis of the circuit information; extracting interconnection pairs from a result of the initial layout; extracting test point insertion candidates on the basis of the controllability probabilities and the interconnection pairs; judging whether the test point insertion candidates exist; selecting test point insertion positions if the test point insertion candidates exist; selecting circuit structures of test points to be inserted at the test point insertion positions; virtually inserting the test points having the selected circuit structures; performing re-layout on a circuit in which the test points have been inserted virtually; judging whether circuit overhead of a result of the re-layout is within a prescribed range; and reducing the number of test points if the circuit overhead exceeds the prescribed range.

In the above-described method, causes of a low fault coverage are extracted by calculating 0-controllability probabilities and 1-controllability probabilities on the basis of the circuit information and interconnection pairs are extracted from layout information. The number of effective test points can be reduced by using those kinds of information. This makes it possible to reduce the load of layout design when test circuits are inserted at the test points and to attain a high fault coverage while preventing increase in chip size.

The test circuit inserting method according to the invention further comprises, after the step of virtually inserting the test points having the selected circuit structures, the step of connecting the inserted test points to form scan chains. In this method, arbitrary values can be set at test points via a scan chain that is formed by connecting the test points. This makes it possible to perform a test while activating circuit states even if the controllability probabilities have any values, and hence to close in on fault positions early when the faults have occurred.

The test circuit inserting method for a semiconductor integrated circuit according to the invention further comprises, after the step of inputting circuit information, the step of inputting fault model information relating to the circuit information, and comprises, after the step of selecting circuit structures of test points, the step of selecting test points corresponding to the fault model. According to this method, the number of test point insertion positions that are effective for a defect analysis can be reduced on the basis of the fault model information. This facilitates identification of faults in a test result and makes it possible to perform a defect analysis easily.

In the test circuit inserting method for a semiconductor integrated circuit according to the invention, the step of extracting interconnection pairs extracts interconnection pairs whose wiring interval is shorter than a reference value or interconnection pairs whose parallel wiring length in the same layer is greater than a reference value.

In the test circuit inserting method for a semiconductor integrated circuit according to the invention, the step of extracting interconnection pairs extracts interconnection pairs whose final stage cells have the same ability among the interconnection pairs that are extracted because their wiring interval is shorter than the prescribed value or their parallel wiring length is greater than the reference value.

In the test circuit inserting method for a semiconductor integrated circuit according to the invention, the step of extracting interconnection pairs extracts interconnection pairs whose interconnections exist in different mask layers and cross each other.

In the test circuit inserting method for a semiconductor integrated circuit according to the invention, the step of selecting test point insertion positions selects, as a test point insertion position, one of positions before and behind parallel wiring portions of signal lines when an interconnection pair whose parallel wiring length is greater than the reference value is extracted.

In the test circuit inserting method for a semiconductor integrated circuit according to the invention, the step of selecting circuit structures of test points checks whether one of the extracted interconnection pairs is included in another of the extracted interconnection pairs.

According to this method, test circuits can be inserted at positions where a fault will occur at a high probability with the layout-related aspect taken into consideration. This makes it possible to avoid wiring congestion due to insertion of test circuits and thereby reduce the load of layout design when test circuits are inserted at test points, which in turn makes it possible to obtain a high fault coverage while preventing increase in chip size.

In the test circuit inserting method for a semiconductor integrated circuit according to the invention, the step of reducing the number of test points selects circuit structures of test points in accordance with controllability probabilities of interconnection pairs. According to this method, test points can be inserted at efficient positions by reducing the number of test points on the basis of controllability probabilities. This makes it possible to increase the fault coverage of the entire chip.

A test circuit inserting apparatus for a semiconductor integrated circuit according to the invention comprises means for inputting circuit information; means for calculating controllability probabilities on the basis of the circuit information; means for performing initial layout on the basis of the circuit information; means for extracting interconnection pairs from a result of the initial layout; means for extracting test point insertion candidates on the basis of the controllability probabilities and the interconnection pairs; means for judging whether the test point insertion candidates exist; means for selecting test point insertion positions if the test point insertion candidates exist; means for selecting circuit structures of test points to be inserted at the test point insertion positions; means for virtually inserting the test points having the selected circuit structures; means for performing re-layout on a circuit in which the test points have been inserted virtually; means for judging whether circuit overhead of a result of the re-layout is within a prescribed range; and means for reducing the number of test points if the circuit overhead exceeds the prescribed range.

In the above configuration, causes of a low fault coverage are extracted by calculating 0-controllability probabilities and 1-controllability probabilities on the basis of the circuit information and interconnection pairs are extracted from layout information. The number of effective test points can be reduced by using those kinds of information. This makes it possible to reduce the load of layout design when test circuits are inserted at the test points and to attain a high fault coverage while preventing increase in chip size.

The test circuit inserting apparatus for a semiconductor integrated circuit according to the invention further comprises means for connecting the inserted test points to form scan chains after the test points having the selected circuit structures have been inserted virtually. In this configuration, arbitrary values can be set at test points via a scan chain that is formed by connecting the test points. This makes it possible to perform a test while activating circuit states even if the controllability probabilities have any values, and hence to close in on fault positions early when the faults have occurred.

The test circuit inserting apparatus for a semiconductor integrated circuit according to the invention further comprises means for inputting fault model information relating to the circuit information after the circuit information has been input, and means for selecting test points corresponding to the fault model after the circuit structures of the test points have been selected. According to this configuration, the number of test point insertion positions that are effective for a defect analysis can be reduced on the basis of the fault model information. This facilitates identification of faults in a test result and makes it possible to perform a defect analysis easily.

According to the invention, effective test point insertion positions can be determined by extracting causes of a low fault coverage and extracting, from a result of initial layout, interconnection pairs where a fault will occur at a high probability. This makes it possible to reduce the load of layout design when test circuits are inserted and to attain a high fault coverage while preventing increase in chip size. Further, a defect analysis can be performed easily because test point insertion positions can be determined taking a fault model into consideration.

DESCRIPTION OF THE PREFERRED EMBODIMENT

First Embodiment

Figure 1:
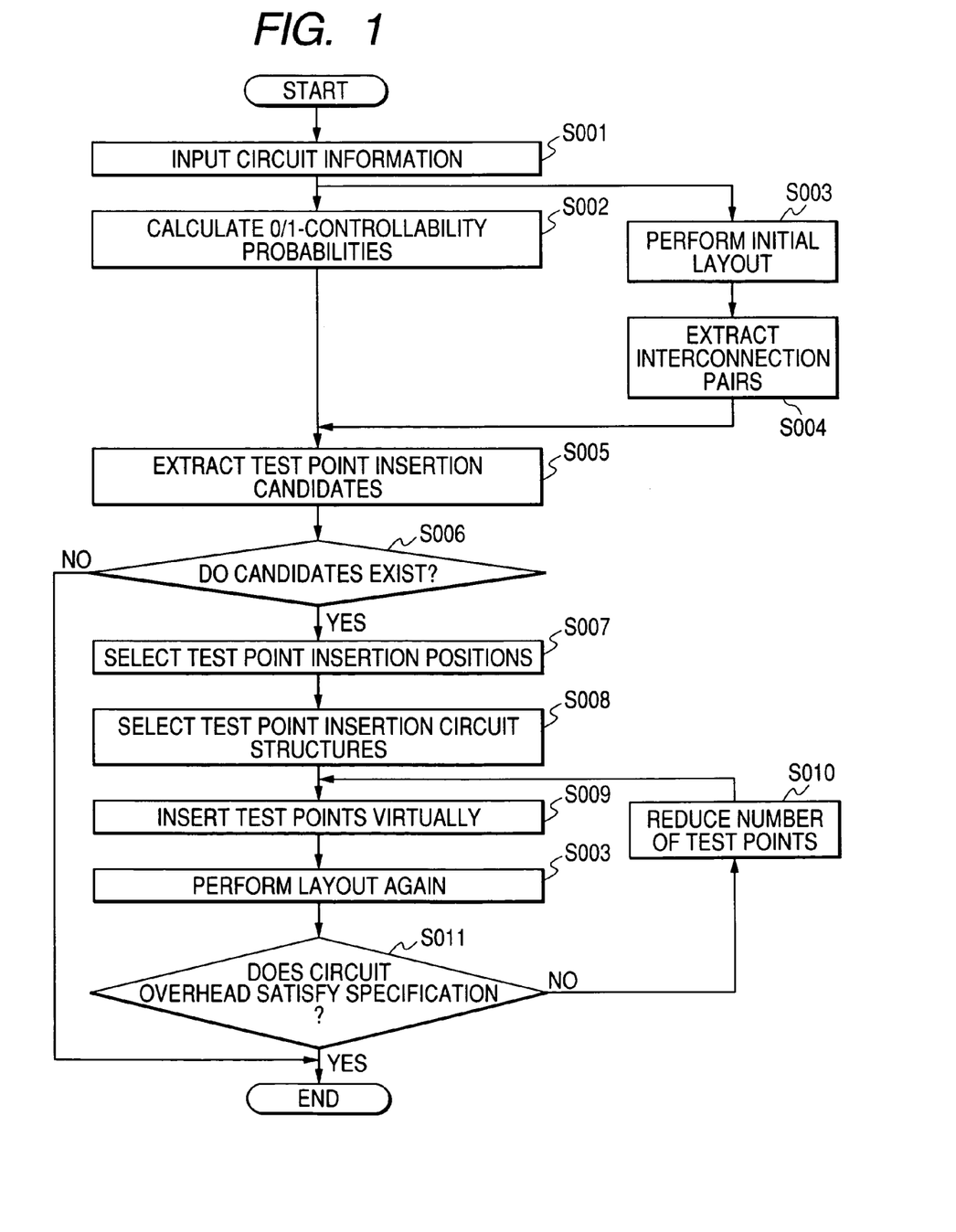
FIG. 1 is a flowchart of a process of a test circuit inserting method for a semiconductor integrated circuit according to a first embodiment of the present invention.

FIG. 1 is a flowchart of a process of a test circuit inserting method for a semiconductor integrated circuit according to a first embodiment of the present invention. As shown in FIG. 1, information of a subject circuit is input at step S001. At step S002, 0-controllability probabilities and 1-controllability probabilities are calculated for this circuit. Initial layout is performed on this circuit at step S003. At step S004, interconnection pairs where a problem may arise are extracted from a result of the initial layout.

Then, at step S005, test point insertion candidates are extracted by using the information obtained at steps S002 and S004. At step S006, it is checked whether the test point insertion candidates extracted at step S005 exist in terms of the configuration of the subject circuit. If it is judged as a result of the check that the candidates exist, test point insertion positions are selected at step S007 and test point insertion circuit structures are selected at step S008.

Then, at step S009, a circuit reflecting the selected items is generated. At step S010, layout is performed again on the test point insertion circuits. At step S011, it is judged on the basis of a layout result whether unnecessary circuit overhead has not occurred as compared to the case before the insertion of the test points. The process is finished if the judgment result at step S011 is "pass." If the judgment result is "rejected," the number of test points is reduced at step S012 and step S009 and the following steps are executed again.

Figure 3:
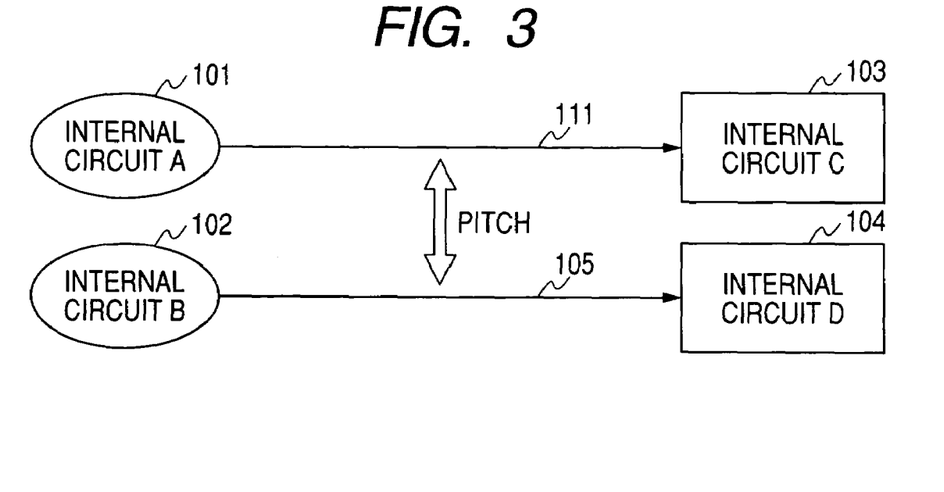
FIG. 3 shows a method for extracting interconnection pairs whose wiring interval is shorter than a reference value.
Figure 4:
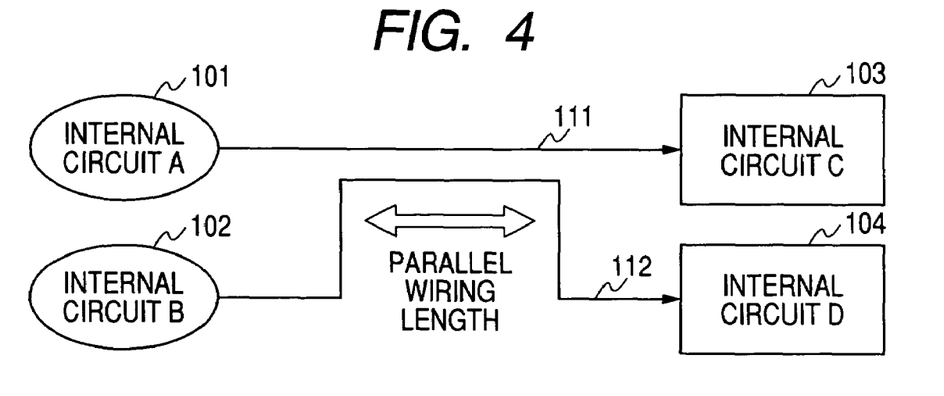
FIG. 4 shows a method for extracting interconnection pairs whose parallel wiring length in the same layer is greater than a reference value.
Figure 5:
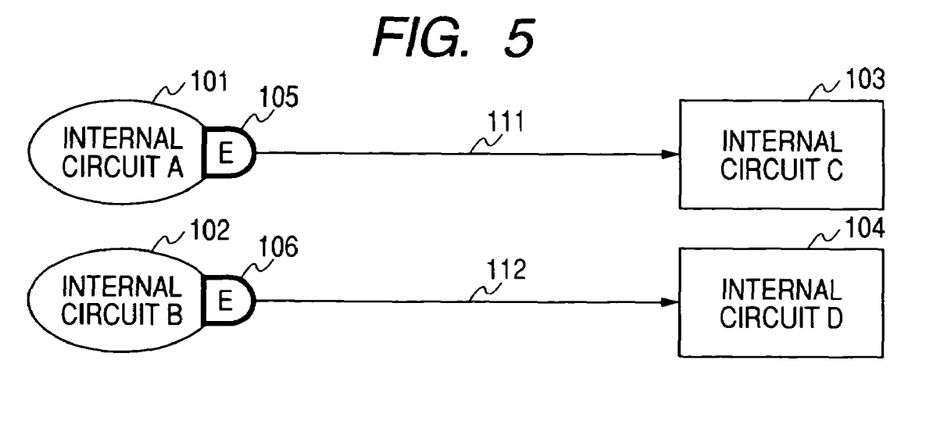
FIG. 5 shows a method for extracting interconnection pairs in which final stage cells have the same ability.

FIGS. 3–6 show methods for extracting interconnection pairs at step S004. In FIGS. 3–5, reference numeral 101 denotes an internal circuit A that generates one signal to go through an interconnection pair; 102, an internal circuit B that generates the other signal to go through the interconnection pair; 103, an internal circuit C that receives the one signal from the internal circuit A; 104, an internal circuit D that receives the other signal from the internal circuit B; 111, one signal line of the interconnection pair; and 112, the other signal line of the interconnection pair.

FIG. 3 shows a method for extracting interconnection pairs whose wiring interval is shorter than a reference value. As shown in FIG. 3, the wiring interval between the signal lines 111 and 112 is defined as a pitch. Interconnection pairs whose pitch is shorter than the reference value are extracted.

FIG. 4 shows a method for extracting interconnection pairs whose parallel wiring length in the same layer is greater than a reference value. As shown in FIG. 4, a length of parallel wiring portions of signal lines 111 and 112 is defined as a parallel wiring length. Interconnection pairs whose parallel wiring length is greater than a reference value are extracted.

FIG. 5 shows a method for extracting interconnection pairs in which final stage cells of the signal lines 111 and 112 have the same ability among interconnection pairs that have been extracted because their pitch is shorter than the reference value or their parallel wiring length is greater than the reference value. In FIG. 5, a final stage cell 105 of the signal line 111 and a final stage cell 106 of the signal line 112 have the same ability.

Figure 6:
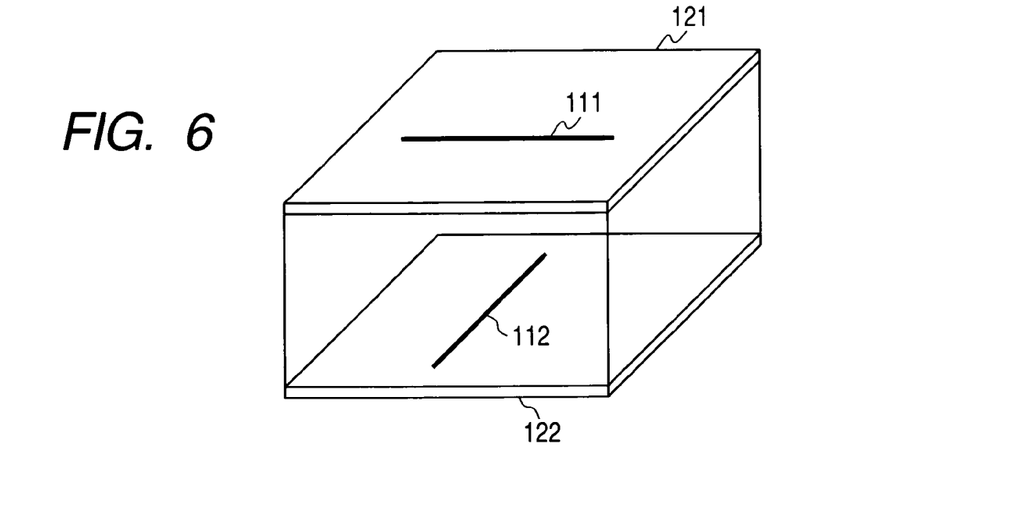
FIG. 6 shows a method for extracting interconnection pairs in which interconnections in different mask layers cross each other.

FIG. 6 shows a method for extracting interconnection pairs in which interconnections in different mask layers cross each other. In FIG. 6, reference numerals 121 and 122 denote an upper wiring mask layer and a lower wiring mask layer, respectively. The signal line 111 in the upper wiring mask layer 121 and the signal line 112 in the lower wiring mask layer 122 that cross each other are defined as crossed interconnections. Wiring pairs that are classified as crossed interconnections are extracted.

Figure 7:
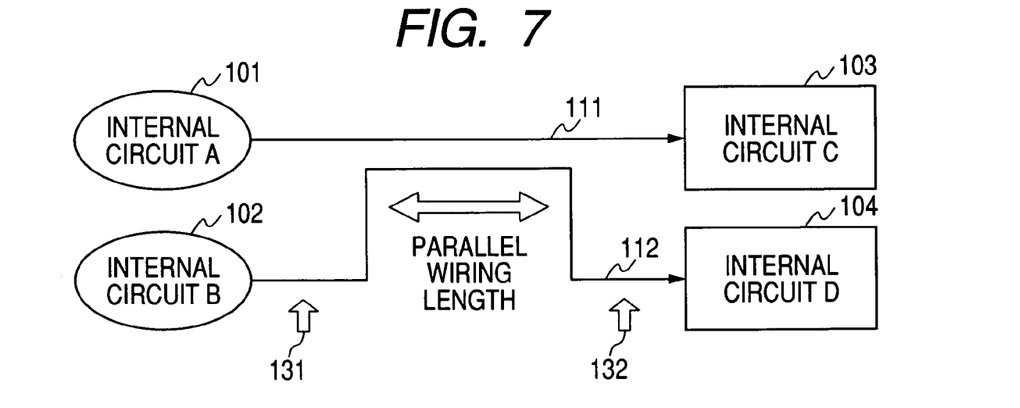
FIG. 7 shows a method for selecting test point insertion positions.

FIG. 7 shows a method for selecting test point insertion positions at step S007. As shown in FIG. 7, when an interconnection pair whose parallel wiring length in the same layer is greater than the reference value as shown in FIG. 4 is extracted, one of positions 131 and 132 that are located before and behind the parallel wiring portions of the signal lines 111 and 112 is selected as a test point insertion position. In the cases of FIGS. 3, 5, and 6, an insertion position is not determined in connection with the reason for extraction of an interconnection pair.

FIGS. 8–15 shows various test point insertion circuit structures to be selected at step S008. In FIGS. 8–15, reference numerals 101–104 denote internal circuits A–D that are the same as shown in FIG. 3.

Further, in reducing of the number of test points at step S012, a test point insertion circuit structure is selected on the basis of a 0-controllability probability and a 1-controllability probability of an interconnection pair that has been selected by one of the above methods.

Figure 8:
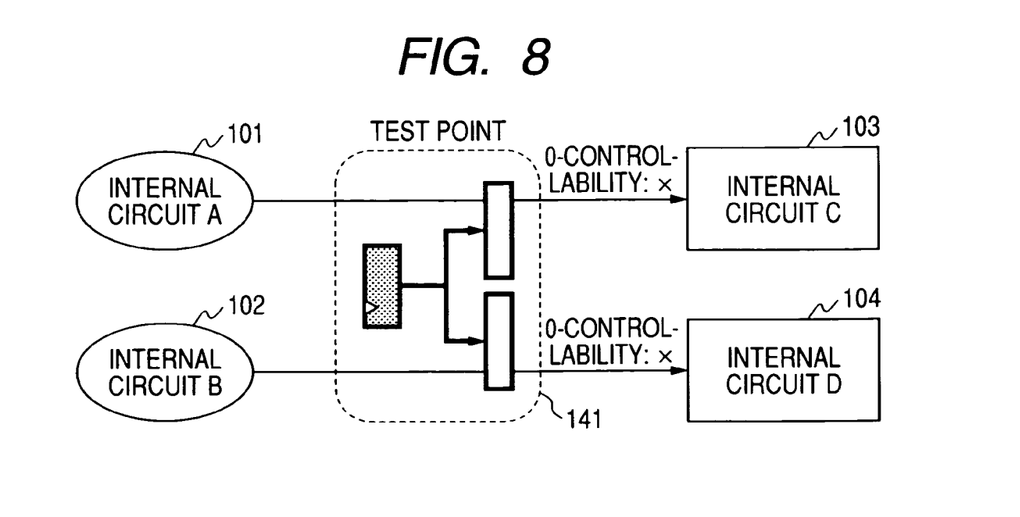
FIG. 8 shows various test point insertion circuit structures to be selected.
Figure 9:
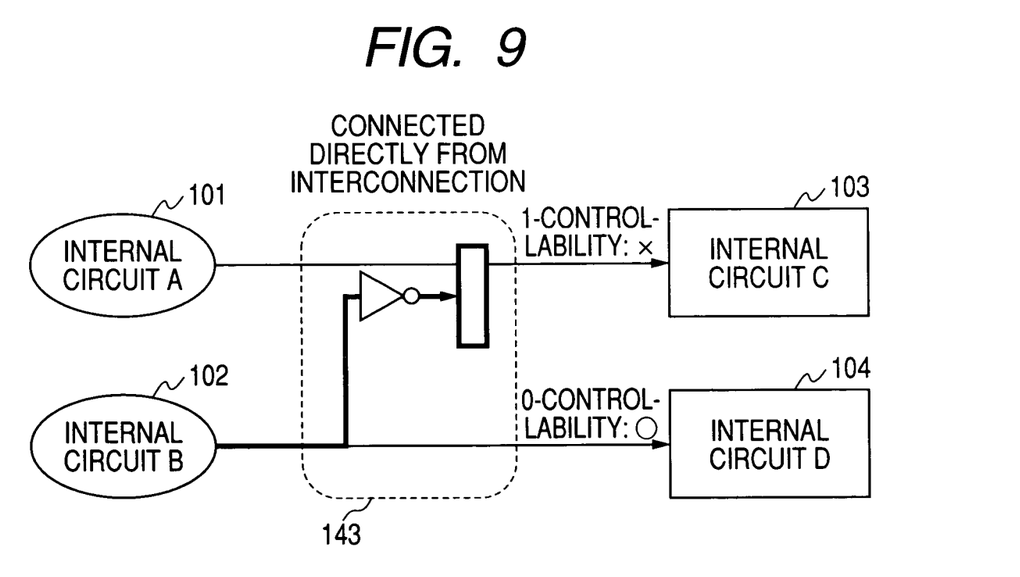
FIG. 9 shows various test point insertion circuit structures to be selected.
Figure 10:
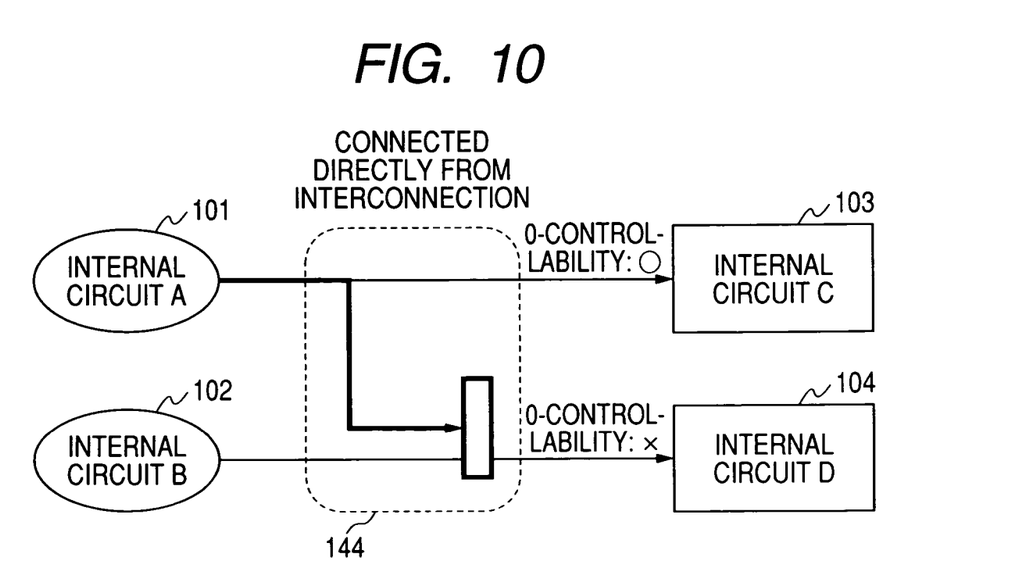
FIG. 10 shows various test point insertion circuit structures to be selected.

Reference numeral 141 in FIG. 8 denotes a test point circuit block that is inserted in the case where the 0-controllability probabilities of the internal circuits C and D are low. Reference numeral 143 in FIG. 9 denotes a test point circuit block that is inserted in the case where the 1-controllability probability of the internal circuit C is low and the 0-controllability probability of the internal circuit D is high. Reference numeral 144 in FIG. 10 denotes a test point circuit block that is inserted in the case where the 0-controllability probability of the internal circuit C is high and the 0-controllability probability of the internal circuit D is low.

Figure 11:
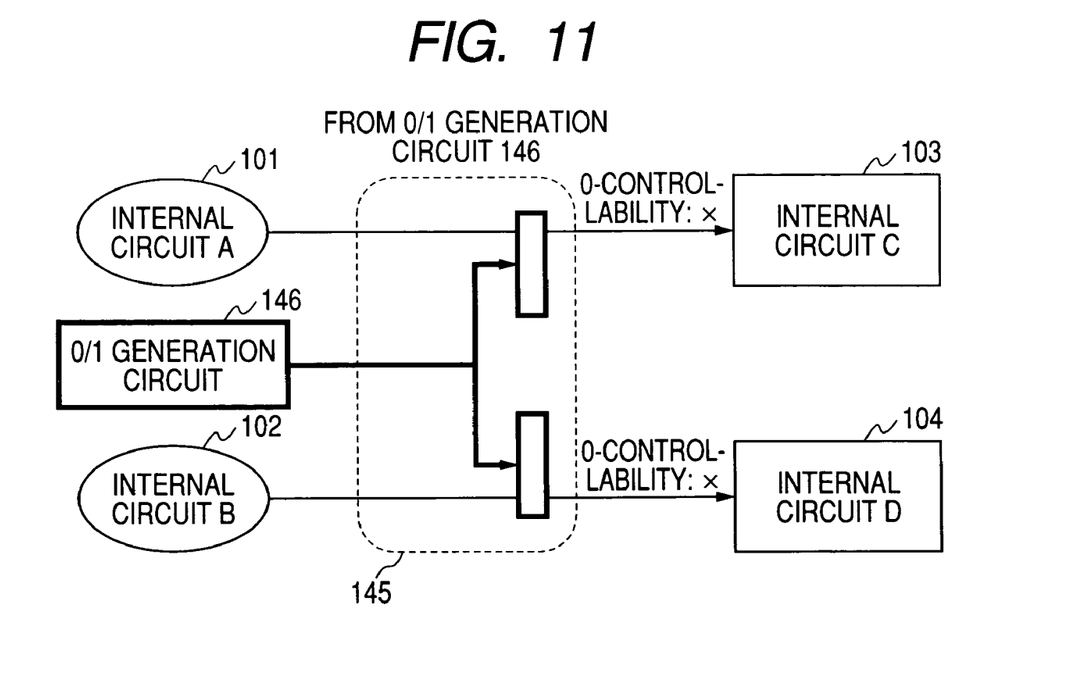
FIG. 11 shows various test point insertion circuit structures to be selected.

Reference numeral 145 in FIG. 11 denotes a test point circuit block that is inserted in the case where the 0-controllability probabilities of the internal circuits C and D are low. Reference numeral 146 denotes a 0/1 generation circuit block that gives a 0/1 control signal to the inserted test point circuit block 145.

Figure 12:
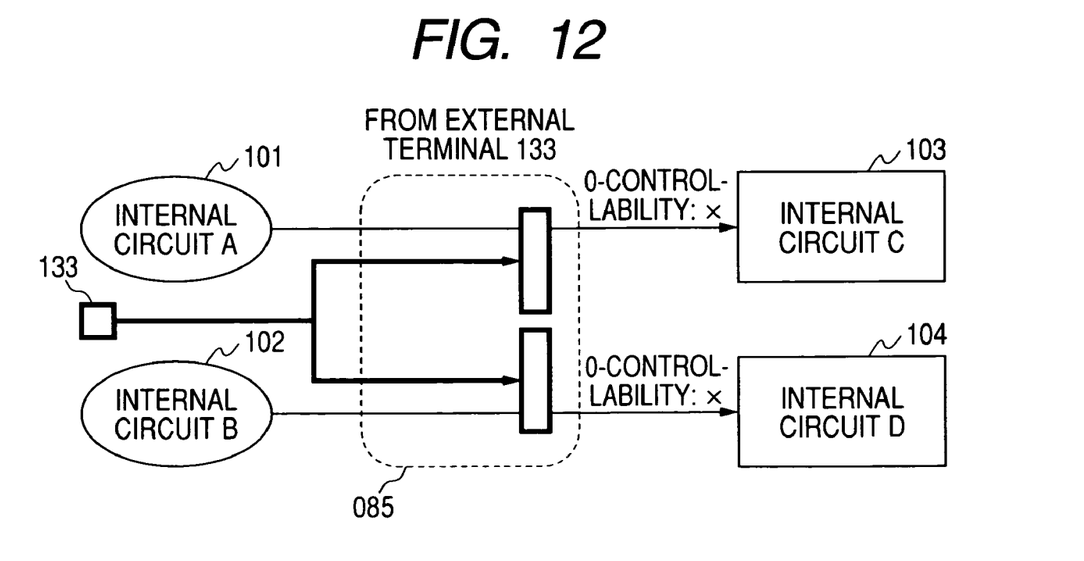
FIG. 12 shows various test point insertion circuit structures to be selected.

In FIG. 12, reference numeral 133 denotes an external circuit that gives a 0/1 control signal to a test point circuit block 145 that is the same as shown in FIG. 11. That is, the 0/1 control signal is supplied from the external circuit 133 instead of the 0/1 generation circuit block 146.

Figure 13:
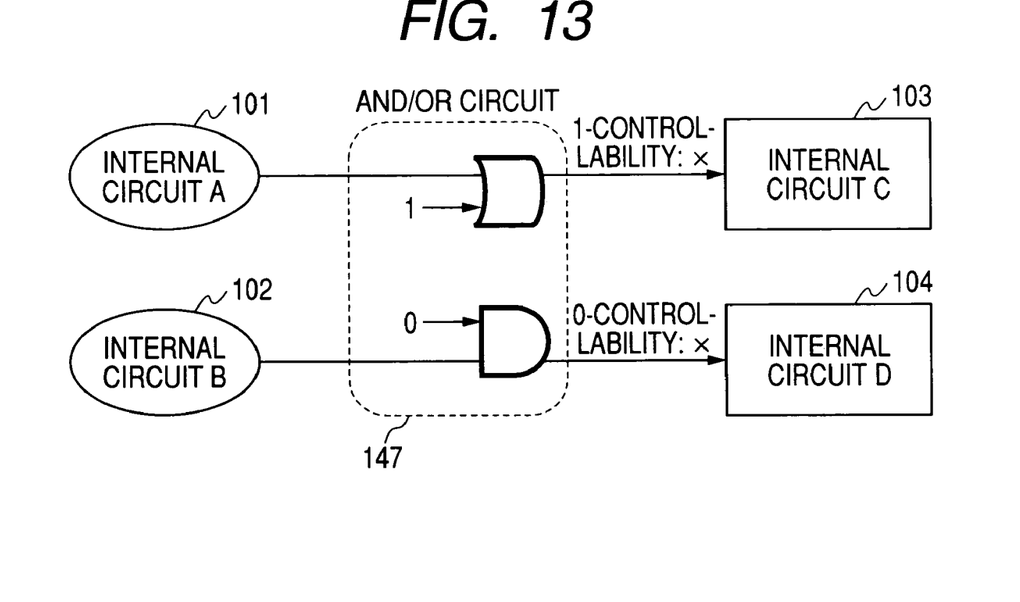
FIG. 13 shows various test point insertion circuit structures to be selected.

In FIG. 13, reference numeral 147 denotes a test point circuit block that is inserted when the 1-controllability probability of the internal circuit C is low and the 0-controllability probability of the internal circuit D is low. The test point circuit block 147 consists of an AND circuit and an OR circuit.

Figure 14:
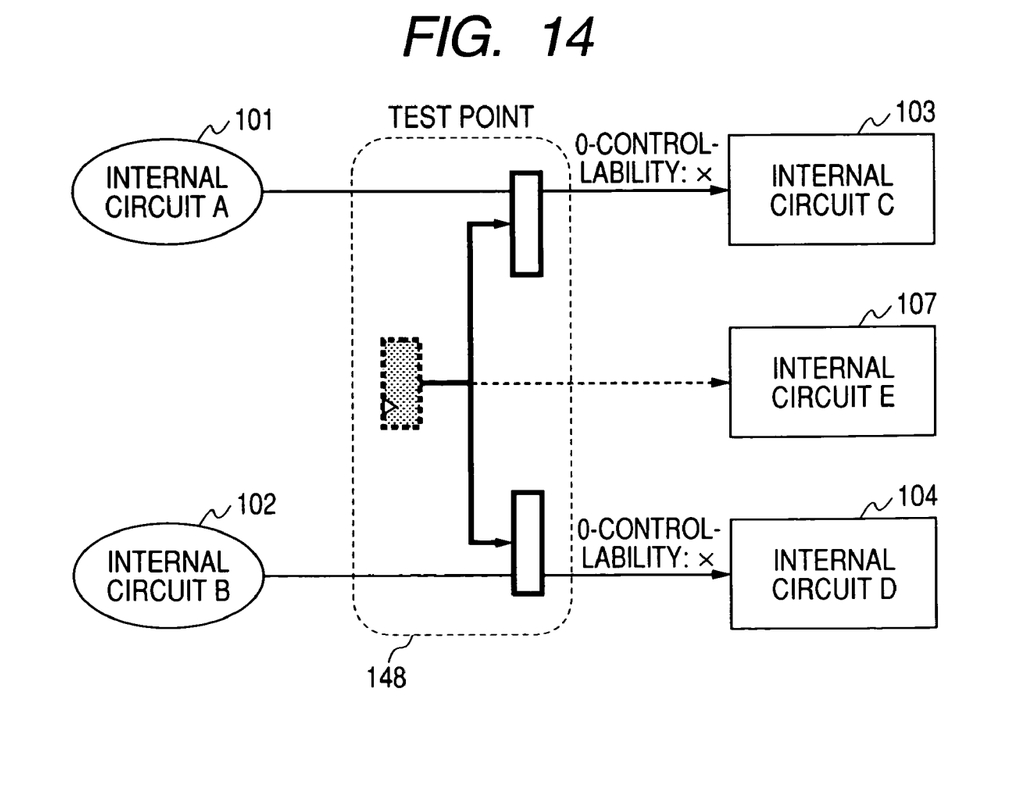
FIG. 14 shows various test point insertion circuit structures to be selected.

In FIG. 14, reference numeral 107 denotes an internal circuit E whose 0-controllability probability is low. Reference numeral 148 denotes a test point circuit block that is inserted for the internal circuit E. However, the 0-controllability probabilities of the internal circuits C and D are low, the test point circuit block 148 is also used for the internal circuits C and D.

Figure 15:
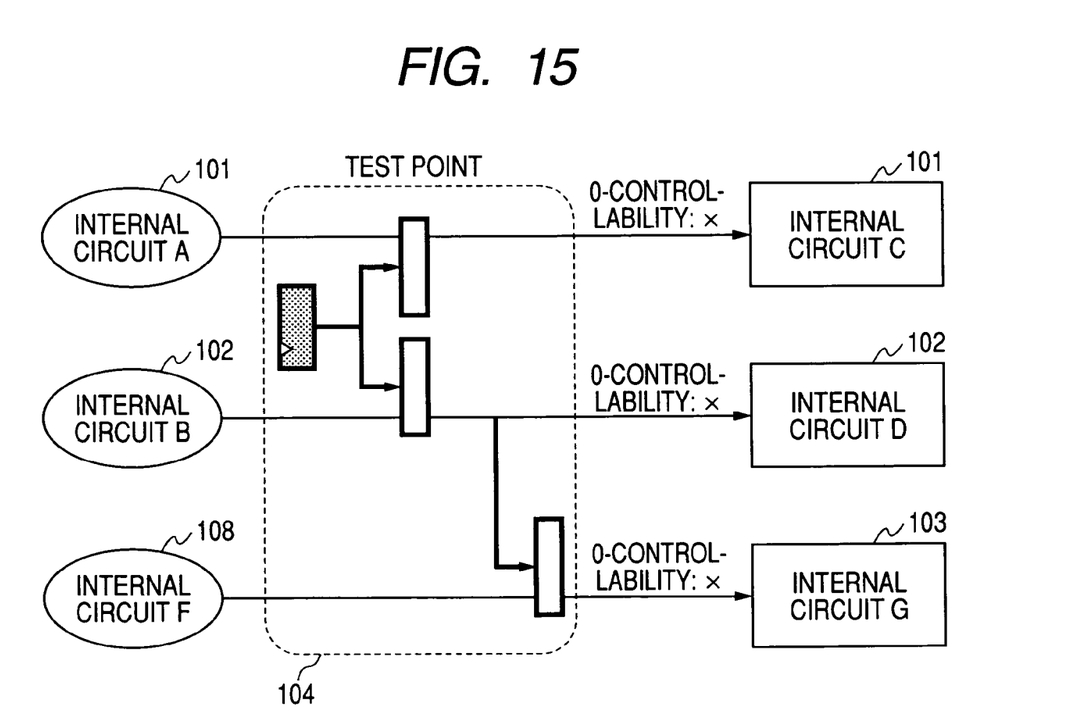
FIG. 15 shows various test point insertion circuit structures to be selected.

In FIG. 15, reference numeral 108 denotes an internal circuit F that are adjacent to the interconnection pair of the internal circuits A and B and generates a signal. Reference numeral 109 denotes an internal circuit that receives the signal from the internal circuit F. Reference numeral 149 denotes a test point circuit block that is inserted when the 0-controllability probabilities of the internal circuits C and D is low. In this case, the test point circuit block 149 is expanded so as to be used also for the internal circuit F.

Figure 16A:
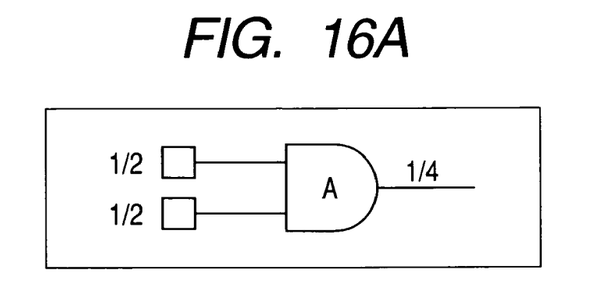
FIG. 16 illustrates a method for calculating 0/1-controllability probabilities and the concept of a controllability probability after insertion of a test point.
Figure 16B:
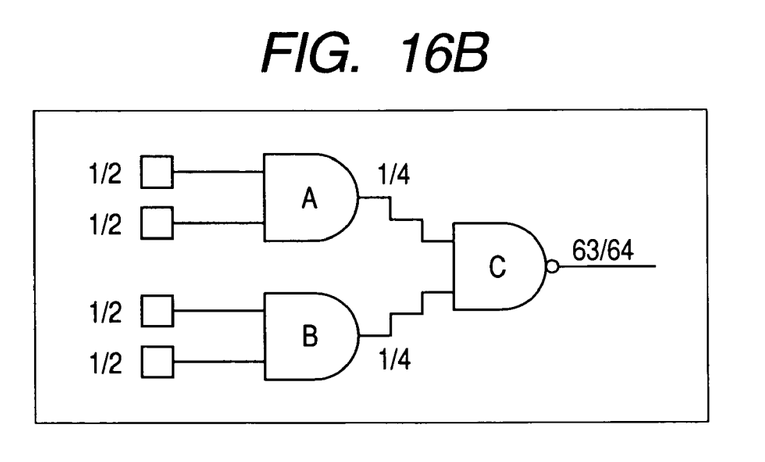

FIG. 16. illustrates a method for calculating 0/1-controllability probabilities and the concept of a controllability probability after insertion of a test point. FIG. 16(a) shows probabilities at which the input signal and the output signal of a circuit A become "1," respectively. Similarly, in the circuit structure of FIG. 16(b), the 1-controllability probabilities of the input signals of a circuit C are equal to ¼ and the 0-controllability probability of the output signal of the circuit C is equal to 1/64 (the 1-controllability probability is equal to 63/64) and hence the controllability is low.

Figure 16C:
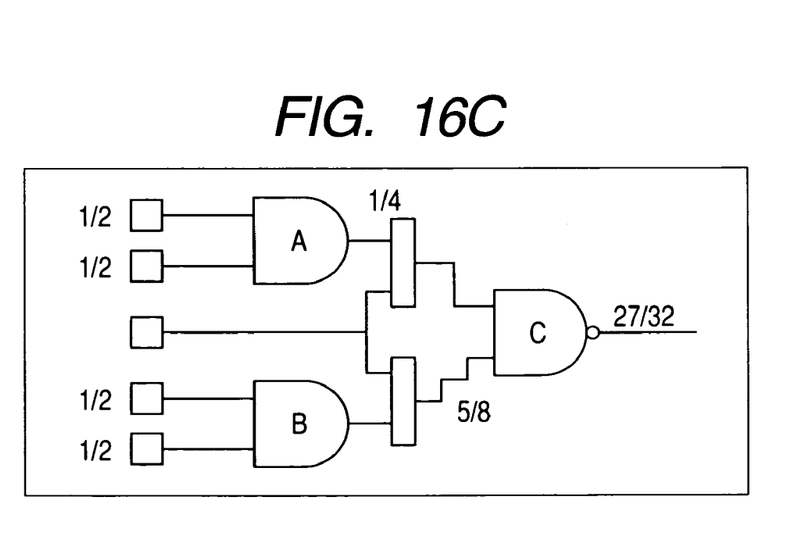

To increase the controllability of this circuit, a test point is inserted as shown in FIG. 16(C). The controllability of the input signal of the circuit C is increased as shown in the figure. Judging whether the 0/1-controllability probabilities of each circuit structure is high or low by using this controllability probability as a reference makes it possible to insert a test point at an efficient point and thereby increase the fault coverage of the entire chip.

Figure 17:
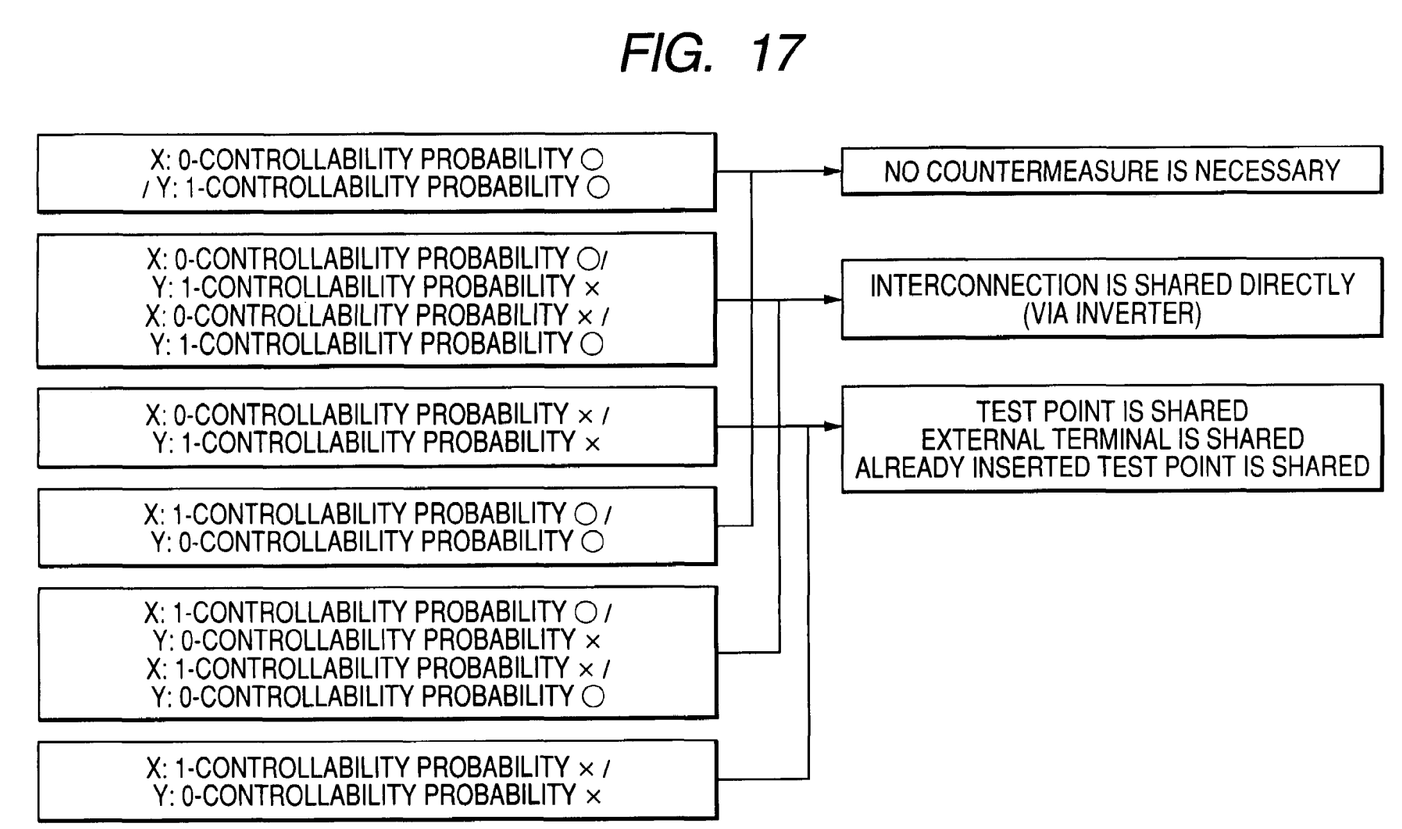
FIG. 17 illustrates the concept of efficient selection of a test point insertion circuit structure based on the 0/1-controllability probabilities of an interconnection pair.

FIG. 17 illustrates the concept of efficient selection of a test point insertion circuit structure based on the 0/1-controllability probabilities of a pair of interconnections X and Y. In reducing the number of test points at step S012, priority ranks of circuit selection are assigned to respective controllability conditions shown in FIG. 17 and the number of test points is reduced in accordance with a circuit specification. This makes it possible to adapt to the specification in a flexible manner and thereby enable an optimum chip design.

Figure 18:
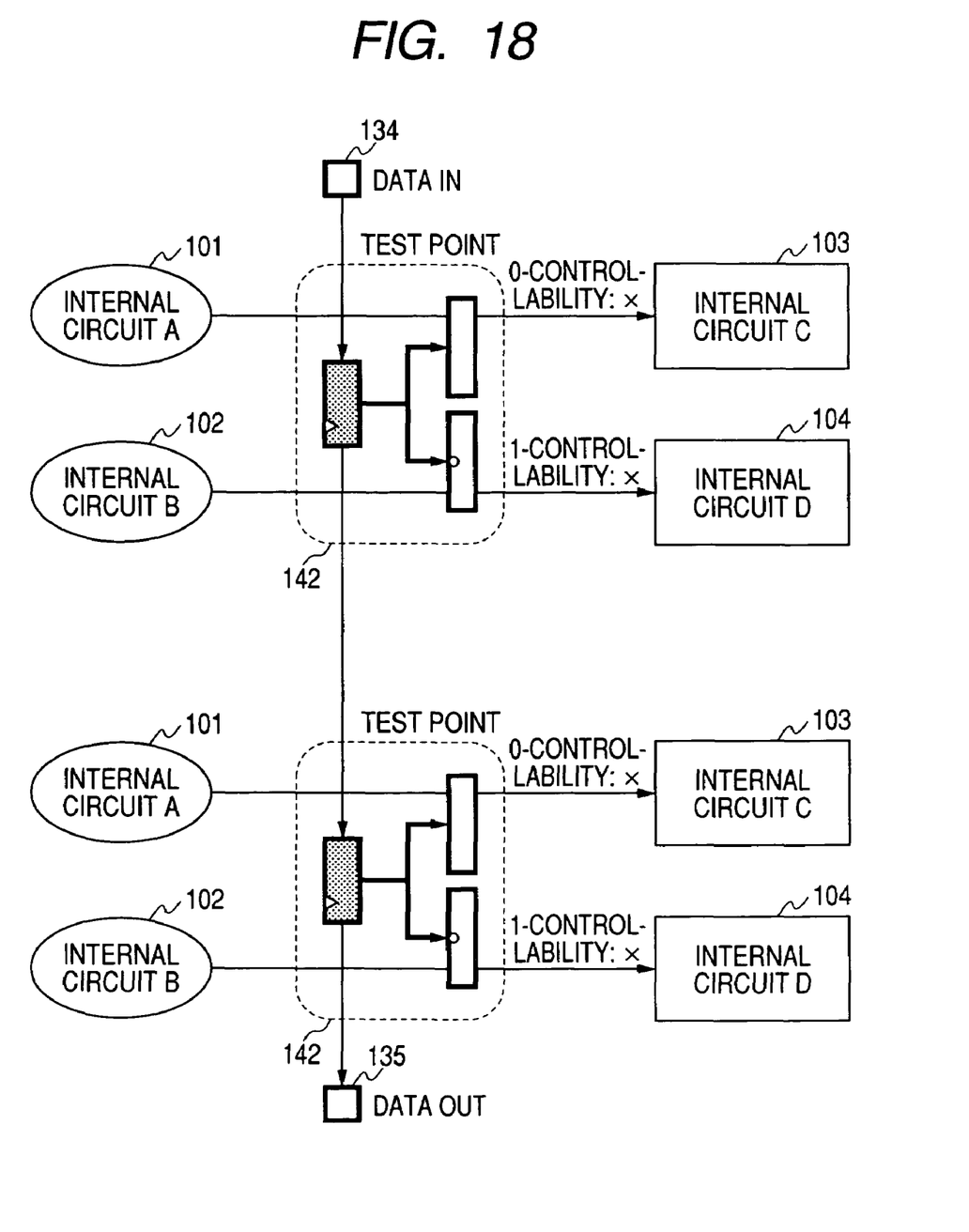
FIG. 18 shows a configuration in which test points are connected to each other to form a single scan chain.

FIG. 18 shows a configuration in which test points are connected to each other to form a single scan chain. As shown in FIG. 18, there are a plurality of interconnection pairs each of which connects internal circuits 101–104 that are the same as shown in FIG. 3. Test point circuit blocks 142 are inserted in the respective interconnection pairs.

Flip-flops of the respective test point circuit blocks 142 are provided between a scan input terminal 134 and a scan output terminal 135 so as to form a scan chain. Providing such scan chains makes it, for example, respective controllability conditions makes it possible to perform a test while activating circuit states of the same condition and thereby close in on faults early when they have occurred. As described above, according to this embodiment, causes of a low fault coverage are extracted by calculating 0-controllability probabilities and 1-controllability probabilities from circuit information and interconnection pairs are extracted from layout information. The number of effective test points can be reduced by step S005 and the following steps by using those kinds of information. This makes it possible to reduce the load of layout design when test circuits are inserted at the test points and to attain a high fault coverage while preventing increase in chip size.

Second Embodiment

Figure 2:
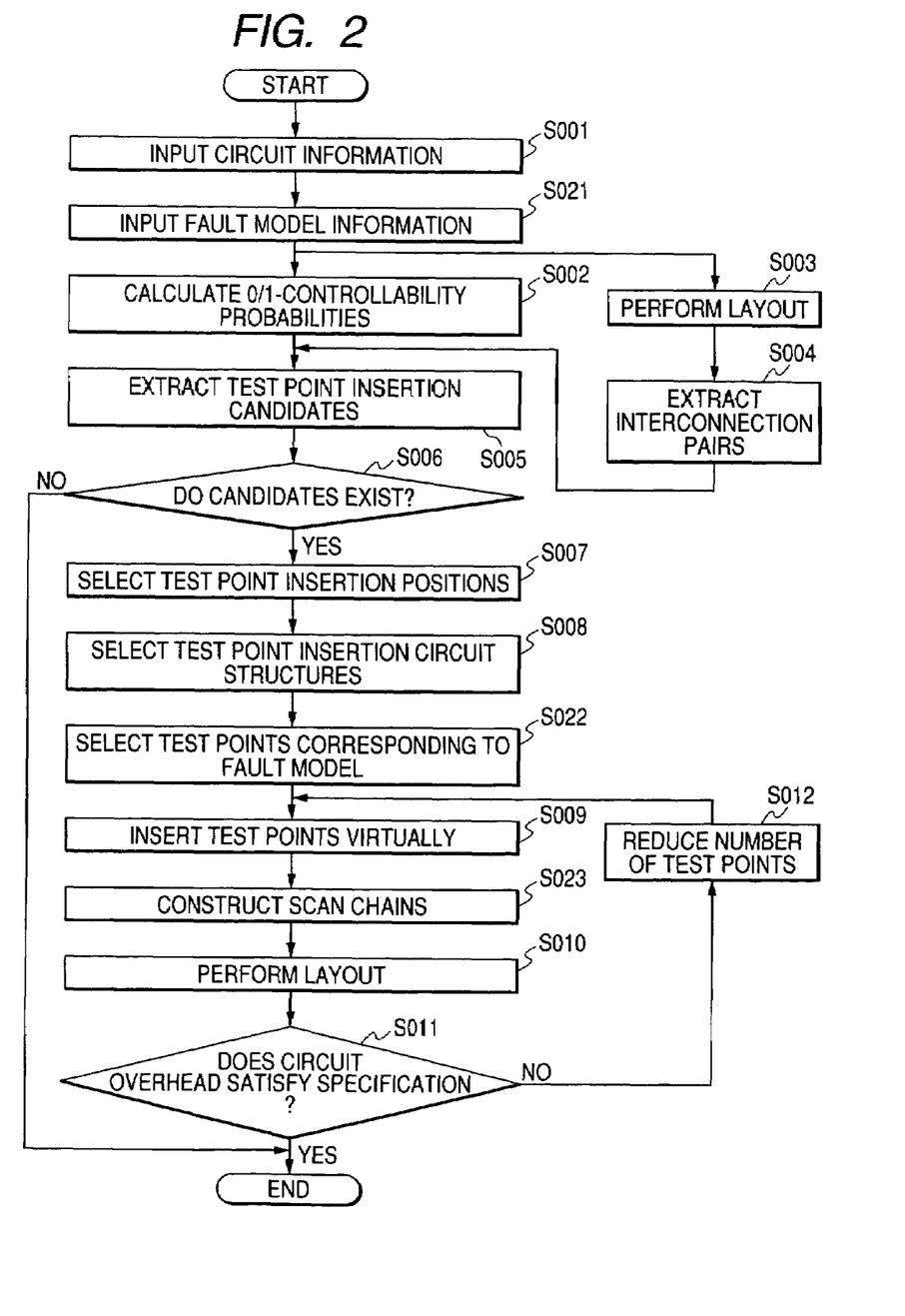
FIG. 2 is a flowchart of a process of a test circuit inserting method for a semiconductor integrated circuit according to a second embodiment of the invention.

FIG. 2 is a flowchart of a process of a test circuit inserting method for a semiconductor integrated circuit according to a second embodiment of the invention. Steps in FIG. 2 having the same steps in FIG. 1 are given the same reference symbols as the latter and will not be described below.

In this embodiment, test points constitute scan chains. Further, to facilitate a defect analysis of a test result, fault model information is input in advance and the number of insertion positions of test points that are effective for the defect analysis is reduced in inserting test points. To this end, steps S021–S023 are added to the flowchart of FIG. 1.

As shown in FIG. 2, fault model information as a subject of analysis is input at step S021 immediately after circuit information is input at step S001. After circuit structures of test points to be inserted are selected by step S008 and the preceding steps, test points corresponding to the fault model that was set at step S021 are selected at step S022.

At step S023, scan chains are constructed by connecting the test points that were inserted at step S009. As a result, scan chains formed by the test points corresponding to the fault model are constructed. Layout is performed at step S010 and the following steps are then executed, whereby the number of insertion positions of test points that are effective for a defect analysis is reduced.

Referring to FIG. 18, in the case where the controllability probabilities of the internal circuits C and D that correspond to an interconnection pair are opposite to each other (the 0-controllability of the internal circuit C is low (indicated by mark "x") and the 1-controllability of the internal circuit D is low), the test point is regarded as one that is directed to an inter-interconnection bridge fault. Therefore, if a scan chain is constructed by test points that satisfy this condition, it can be regarded as a scan chain for bridge fault detection.

As described above, according to this embodiment, scan chains constructed by test points corresponding to a fault model are used and the number of insertion positions of test points that are effective for a defect analysis is reduced, which facilitates identification of faults in a test result and makes it possible to perform a defect analysis easily.

In the test circuit inserting method and apparatus for a semiconductor integrated circuit according to the invention, effective test point insertion positions can be determined by extracting causes of a low fault coverage and extracting, from a result of initial layout, interconnection pairs where a fault will occur at a high probability. This makes it possible to reduce the load of layout design when test circuits are inserted and to attain a high fault coverage while preventing increase in chip size. Further, a defect analysis can be performed easily because test point insertion positions can be determined taking a fault model into consideration. As such, the invention is useful when applied to a design-for-testability technique for a semiconductor integrated circuit, in particular, a test circuit inserting method, a test circuit inserting apparatus, or the like.

What is claimed is:

1. A test circuit inserting method for a semiconductor integrated circuit, comprising the steps of:
   inputting circuit information;
   calculating controllability probabilities on a basis of the circuit information;
   performing initial layout on the basis of the circuit information;
   extracting interconnection pairs from a result of the initial layout;
   extracting test point insertion candidates on a basis of the controllability probabilities and the interconnection pairs;
   judging whether the test point insertion candidates exist;
   selecting test point insertion positions if the test point insertion candidates exist;

selecting circuit structures of test points to be inserted at the test point insertion positions;

virtually inserting the test points having the selected circuit structures;

performing re-layout on a circuit in which the test points have been inserted virtually;

judging whether circuit overhead of a result of the re-layout is within a prescribed range; and reducing a number of test points if the circuit overhead exceeds the prescribed range.

2. The test circuit inserting method for a semiconductor integrated circuit according to claim 1, further comprising, after performing the step of virtually inserting the test points having the selected circuit structures, a step of connecting the inserted test points to form scan chains.

3. The test circuit inserting method for a semiconductor integrated circuit according to claim 1, further comprising, after performing the step of inputting circuit information, a step of inputting fault model information relating to the circuit information, and further comprising, after performing the step of selecting circuit structures of test points, a step of selecting test points corresponding to the fault model.

4. The test circuit inserting method for a semiconductor integrated circuit according to claim 1, wherein the step of extracting interconnection pairs extracts interconnection pairs whose wiring interval is shorter than a reference value.

5. The test circuit inserting method for a semiconductor integrated circuit according to claim 1, wherein the step of extracting interconnection pairs extracts interconnection pairs whose parallel wiring length in the same layer is greater than a reference value.

6. The test circuit inserting method for a semiconductor integrated circuit according to claim 4 or 5, wherein the step of extracting interconnection pairs extracts interconnection pairs whose final stage cells have the same ability among the interconnection pairs that are extracted because their wiring interval is shorter than a prescribed value or their parallel wiring length is greater than the reference value.

7. The test circuit inserting method for a semiconductor integrated circuit according to claim 1, wherein the step of extracting interconnection pairs extracts interconnection pairs whose interconnections exist in different mask layers and cross each other.

8. The test circuit inserting method for a semiconductor integrated circuit according to claim 5, wherein the step of selecting test point insertion positions selects, as a test point insertion position, one of positions before and behind parallel wiring portions of signal lines when an interconnection pair whose parallel wiring length is greater than the reference value is extracted.

9. The test circuit inserting method for a semiconductor integrated circuit according to any one of claims 4, 5, and 7, wherein the step of selecting circuit structures of test points checks whether one of the extracted interconnection pairs is included in another of the extracted interconnection pairs.

10. The test circuit inserting method for a semiconductor integrated circuit according to any one of claims 4, 5, and 7, wherein the step of reducing the number of test points selects circuit structures of test points in accordance with controllability probabilities of interconnection pairs.

11. A test circuit inserting apparatus for a semiconductor integrated circuit, comprising:

means for inputting circuit information;

means for calculating controllability probabilities on a basis of the circuit information;

means for performing initial layout on the basis of the circuit information;

means for extracting interconnection pairs from a result of the initial layout;

means for extracting test point insertion candidates on a basis of the controllability probabilities and the interconnection pairs;

means for judging whether the test point insertion candidates exist;

means for selecting test point insertion positions if the test point insertion candidates exist;

means for selecting circuit structures of test points to be inserted at the test point insertion positions;

means for virtually inserting the test points having the selected circuit structures;

means for performing re-layout on a circuit in which the test points have been inserted virtually;

means for judging whether circuit overhead of a result of the re-layout is within a prescribed range; and means for reducing a number of test points if the circuit overhead exceeds the prescribed range.

12. The test circuit inserting apparatus for a semiconductor integrated circuit according to claim 11, further comprising means for connecting the inserted test points to form scan chains after the test points having the selected circuit structures have been inserted virtually.

13. The test circuit inserting apparatus for a semiconductor integrated circuit according to claim 11, further comprising means for inputting fault model information relating to the circuit information after the circuit information has been input, and means for selecting test points corresponding to the fault model after the circuit structures of the test points have been selected.

14. A computer-readable recording medium on which a program is stored, said program causing a computer to perform the functions of:

calculating controllability probabilities on a basis of input circuit information;

performing initial layout on the basis of the circuit information;

extracting interconnection pairs from a result of the initial layout;

extracting test point insertion candidates on a basis of the controllability probabilities and the interconnection pairs;

judging whether the test point insertion candidates exist;

selecting test point insertion positions if the test point insertion candidates exist;

selecting circuit structures of test points to be inserted at the test point insertion positions;

virtually inserting the test points having the selected circuit structures;

performing re-layout on a circuit in which the test points have been inserted virtually;

judging whether circuit overhead of a result of the re-layout is within a prescribed range; and reducing a number of test points if the circuit overhead exceeds the prescribed range.

* * * * *